US006960365B2

(12) United States Patent
Ning

(10) Patent No.: US 6,960,365 B2
(45) Date of Patent: Nov. 1, 2005

(54) VERTICAL MIMCAP MANUFACTURING METHOD

(75) Inventor: Xian J. Ning, Mohegan Lake, NY (US)

(73) Assignee: Infineon Technologies AG, Munich (DE)

(*) Notice: Subject to any disclaimer, the term of this patent is extended or adjusted under 35 U.S.C. 154(b) by 232 days.

(21) Appl. No.: 10/057,575

(22) Filed: Jan. 25, 2002

(65) Prior Publication Data

US 2003/0143322 A1 Jul. 31, 2003

(51) Int. Cl.$^7$ .............................. B05D 5/12; H01L 21/20; H01L 29/00
(52) U.S. Cl. ........................ 427/79; 257/303; 257/306; 438/239; 438/243; 438/253; 438/397
(58) Field of Search ................... 438/239, 243, 438/253, 386, 397; 257/303, 306; 427/78–80

(56) References Cited

U.S. PATENT DOCUMENTS

| 5,654,581 | A  |   | 8/1997  | Radosevich et al. |         |
|-----------|----|---|---------|-------------------|---------|
| 5,918,135 | A  | * | 6/1999  | Lee et al.        | 438/393 |
| 6,271,084 | B1 | * | 8/2001  | Tu et al.         | 438/253 |
| 6,417,535 | B1 | * | 7/2002  | Johnson et al.    | 257/306 |
| 6,451,667 | B1 | * | 9/2002  | Ning              | 438/397 |
| 6,528,366 | B1 | * | 3/2003  | Tu et al.         | 438/253 |
| 6,620,701 | B2 | * | 9/2003  | Ning              | 438/396 |
| 6,723,600 | B2 | * | 4/2004  | Wong et al.       | 438/244 |
| 2002/0153551 | A1 | * | 10/2002 | Wong et al.    | 257/303 |
| 2003/0073282 | A1 | * | 4/2003  | Ning              | 438/234 |

OTHER PUBLICATIONS

Kar–Roy, Arjun, Hu, Chun, Racanelli, Marco, Compton, Cory A., Kempf, Paul, Jolly, Gurvinder, Sherman, Phil N., Zheng, Jie, Zhang, Zhe and Yin, Aiguo, "High Density Metal Insulator Metal Capacitors Using PECVD Nitride for Mixed Signal and RF Circuits", IEEE, 1999, IITC 99–245–247.

Liu, Ruichen, Lin, Cheng–Yih, Harris, Edward, Merchant, Sailesh, Downey, Stephen W., Weber, Gary, Ciampa, Nicholas A., Tai, Wai, Lai, Warren, Y. C., Morris, Mark D., Bower, J. Eric, Miner, John F. Frackoviak, John, Mansfield, William, Barr, David, Keller, Robert, Chang, Chong–Ping, Pai, Chien–Shing, Rogers, Sara N. and Gregor, Richard, "Single Mask Metal–Insulator–Metal (MIM) Capacitor with Copper Damascene Metallization for Sub–0.18μm Mixed Mode Signal and System–on–a–Chip (SoC) Applications", IEEE, 2000, pp. 111–113.

Armacost, M., Augustin, A., Felsner, P., Fend, Y., Friese, G., Heidenreich, J., Hueckel, G., Prigge, O., Stein, K., "A High Reliability Metal Insulator Metal Capacitor for 0.18 μm Copper Technology", 4 pages.

* cited by examiner

Primary Examiner—Brian K. Talbot
(74) Attorney, Agent, or Firm—Slater & Matsil, L.L.P.

(57) ABSTRACT

A method of manufacturing a vertical metal-insulator-metal capacitor (MIMCap) (10) in regions (19) of an insulating layer (14). Trenches for both conductive lines and vertical MIMCap's are formed in the insulating layer (14), and regions (19) are covered by resist (20) while the conductive lines (24) are deposited on the wafer. The resist (20) is removed, and the MIMCap dielectric and top plate conductive material (28) is deposited, forming a vertical MIMCap in regions (19).

20 Claims, 2 Drawing Sheets

VERTICAL MIMCAP MANUFACTURING METHOD

CROSS-REFERENCE TO RELATED APPLICATIONS

Embodiments of the present invention are related to commonly-assigned U.S. patent applications Ser. No. 09/742,918 filed on Dec. 21, 2000 by Ning, now U.S. Pat. No. 6,451,667 entitled "Self-Aligned Double-sided Vertical MIMCap", and Ser. No. 09/977,004 filed on Oct. 12, 2001 by Ning, entitled "Vertical/Horizontal MIMCap Method", which are incorporated herein by reference.

TECHNICAL FIELD

Embodiments of the present invention relate generally to the fabrication of semiconductor devices, and more particularly to metal-insulator-metal capacitors (MIMCap's).

BACKGROUND

Semiconductor devices are widely used for integrated circuits for electronic applications, including radios, televisions and personal computing devices, as examples. Such integrated circuits typically include multiple transistors fabricated in single crystal silicon. It is common for there to be millions of semiconductor devices on a single semiconductor product. Many integrated circuits now include multiple levels of metallization for interconnections.

The manufacturing process flow for semiconductors is generally referred to in two time periods: front-end-of-line (FEOL) and back-end-of-line (BEOL). Higher temperature processes are typically performed in the FEOL, during which impurity implantation, diffusion and formation of active components such as transistors are performed on a semiconductor substrate of a wafer. Lower temperature processes usually take place in the BEOL, which is generally considered to begin upon the formation of the first metallization layer on the wafer.

Capacitors are elements used extensively in semiconductor devices for storing an electric charge. Capacitors essentially comprise two conductive plates separated by an insulator. The capacitance, or amount of charge held by the capacitor per applied voltage, is measured in farads and depends upon a number of parameters such as the area of the plates, the distance between the plates, and the dielectric value of the insulator between the plates, as examples. Capacitors are used in filters, in analog-to-digital converters, memory devices, and control applications, and many other types of semiconductor devices.

One type of capacitor is a MIMCap, which is used frequently in mixed signal devices and logic devices, for example. MIMCap's are used to store a charge in a variety of semiconductor devices, such as mixed signal and analog products. MIMCap's typically require a much lower capacitance than deep trench memory capacitors used in dynamic random access memory (DRAM) devices, for example. A MIMCap may have a capacitance requirement of 1 fF/micrometer$^2$, for example.

Recently, there has been an increase in demand for MIMCap's embedded in BEOL integrated circuits. MIMCap's typically are horizontal MIMCap's comprising two metal plates that sandwich a dielectric parallel to the wafer surface. Prior art horizontal MIMCap's are usually manufactured in the BEOL by forming the bottom capacitive plate in the first or subsequent horizontal metallization layer of a semiconductor wafer. A capacitor dielectric is deposited over the bottom capacitive plate, with a second mask, pattern and etch step being required to form the top capacitive plate.

Alternatively, MIMCap's may be formed between horizontal metallization layers in the BEOL in additional horizontal layers, with each plate requiring a separate pattern and etch level.

A horizontal MIMCap requires a relatively large amount of surface area on a semiconductor wafer. A horizontal MIMCap is a large flat capacitor positioned parallel to the wafer surface covering a large area of the chip, and therefore, MIMCap's do not provide a high area efficiency. As the demand for the capacitance increases, it is desirable to develop MIMCap's that utilize the chip area as efficiently as possible.

A vertical MIMCap, described in patent application Ser. No. 09/742,918 for "Self-Aligned Double-sided Vertical MIMCap", incorporated herein by reference, discloses a vertical MIMCap structure and method that improves the efficiency of the use of chip surface area. Patent application Ser. No. 09/977,004 for "Vertical/Horizontal MIMCap Method", also incorporated herein by reference, describes another way of manufacturing a vertical MIMCap. Vertical MIMCap's are advantageous in that they may be formed in the same inter-level dielectric as metal leads in a metallization layer, saving semiconductor surface area.

SUMMARY OF THE INVENTION

Embodiments of the present invention include novel methods of fabricating vertical MIMCap's. Methods of manufacturing high area efficiency vertical MIMCap's embedded in damascene BEOL metallization layers are described herein, with minimum process complexity added to the common BEOL processes.

In one embodiment, disclosed is a method of fabricating a vertical MIMCap, comprising providing a wafer having a workpiece, depositing an insulating layer over the workpiece, and patterning the insulating layer with a plurality of trenches. The insulating layer comprises at least one first region and at least one second region, and the first region comprises trenches for at least one MIMCap. The method includes depositing a first conductive layer over the insulating layer within the trenches, depositing a resist over the insulating layer first regions, and depositing a second conductive material within the insulating layer second region trenches. The resist is removed, and a thin dielectric layer is deposited over the insulating layer first region within the first region trenches. A third conductive material is deposited over the thin dielectric layer within the first region trenches.

In another embodiment, disclosed is a method of fabricating a vertical MIMCap, comprising providing a wafer having a workpiece, depositing an inter-level dielectric over the workpiece, and patterning the inter-level dielectric with a plurality of trenches. The inter-level dielectric comprises at least one first region and at least one second region, the first region comprising trenches for at least one MIMCap. The second region comprises trenches for a plurality of conductive lines. The method includes depositing a conductive liner over the inter-level dielectric within the trenches, depositing a seed layer over the conductive liner, and depositing a resist over the seed layer. The resist is removed over the seed layer in the inter-level dielectric second regions, leaving resist over the seed layer in the inter-level dielectric first regions. A first conductive material is deposited within the inter-level dielectric second region trenches to form a plurality of conductive lines, and the resist is removed. A MIMCap dielectric is deposited over the inter-level dielectric first region within the first region trenches, and a second conductive material is deposited over the MIMCap dielectric within the first region trenches to form a MIMCap top plate.

Advantages of embodiments of the invention include providing a method of fabricating a vertical MIMCap in a BEOL process, where no additional etch steps are required for manufacturing the vertical MIMCap. A single chemical-mechanical polishing (CMP) step is used to form conductive lines and vertical MIMCap's simultaneously. The vertical MIMCap dielectric may be deposited using plasma-enhanced chemical vapor deposition (PECVD). The vertical MIMCap bottom plate may be comprised of a conductive liner and a seed layer. A resist layer is used to mask vertical MIMCap regions while the conductive lines are filled with conductive material.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

Figure 1:
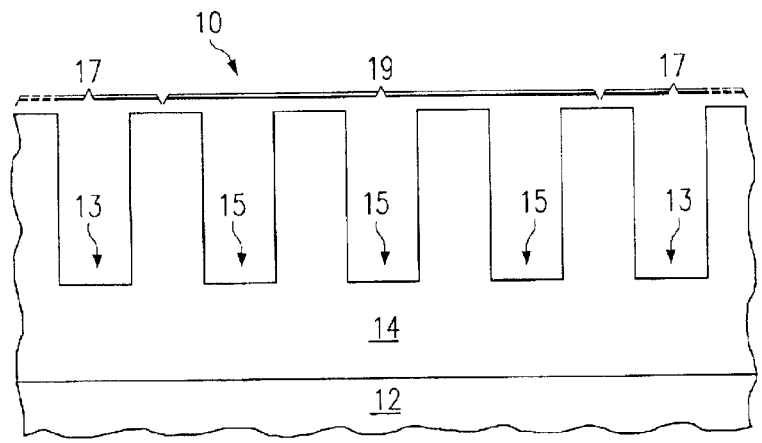
FIGS. 1–6 illustrate cross-sectional views of a semiconductor device including vertical MIMCap's in accordance with embodiments of the present invention, in various stages of fabrication.
Figure 2:
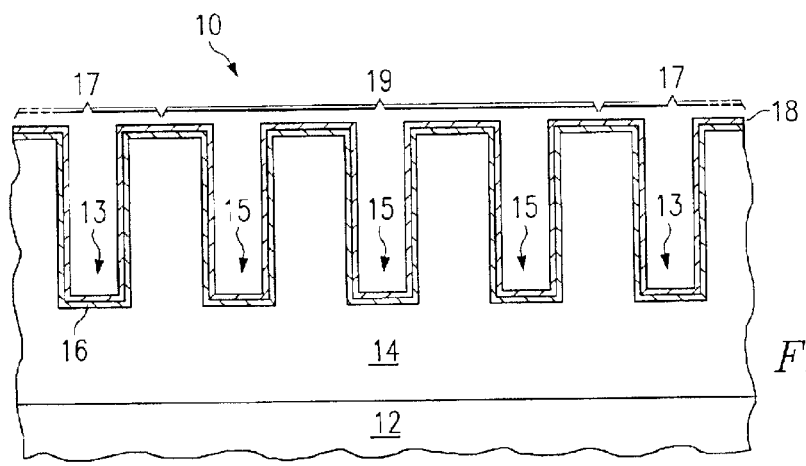

Preferred embodiments of the present invention will be described, followed by a discussion of some advantages of fabricating a vertical MIMCap in accordance with embodiments of the invention.

FIGS. 1–6 show cross-sectional views of a semiconductor device including vertical MIMCap's in accordance with an embodiment of the present invention, in various stages of fabrication. A semiconductor wafer 10 includes a workpiece 12, shown in FIG. 1, which may include a semiconductor substrate comprising silicon or other semiconductor materials covered by an insulating layer, for example. Workpiece 12 may also include other active components or circuits formed in the FEOL, not shown. Workpiece 12 may comprise silicon oxide over single-crystal silicon, for example. The workpiece 12 may include other conductive layers or other semiconductor elements, e.g. transistors, diodes, etc. Compound semiconductors such as GaAs, InP, Si/Ge, SiC, as examples, may be used in place of silicon.

An insulating layer 14 is deposited over the workpiece 12. The insulating layer 14 preferably comprises an inter-level dielectric (ILD) layer, e.g., the wafer first or second inter-level dielectric, as examples, that conductive leads in a metallization layer may also be formed within elsewhere on the wafer 10. The insulating layer 14 preferably comprises silicon dioxide ($SiO_2$) and may alternatively comprise other dielectric materials such as low dielectric constant materials or high dielectric constant materials, for example.

The insulating layer 14 is patterned and etched, preferably in a damascene process, for example, to form trenches 13/15. The patterning process may comprise a single dama-scene or dual-damascene process, as examples. In accordance with embodiments of the invention, the insulating layer 14 is preferably lithographically patterned and reactive ion etched (RIE) to form trenches 15 in a first region 19 of insulating layer 14, the first region 19 comprising areas where vertical MIMCap's will be formed, and trenches 13 in at least one second region 17 where conductive lines or wiring may be formed. The trenches 13/15 may be 0.2 μm wide and 0.4 to 0.6 μm deep, as examples, although the trenches 13/15 may also comprise other dimensions.

A first conductive layer is disposed over the insulating layer 14. The first conductive layer includes a conductive liner 16 and a seed layer 18.

The conductive liner 16 is deposited or formed over the insulating layer 14 within the trenches 13/15. The conductive liner preferably comprises a TaN, TiW, Cu, Si, or combinations thereof, as examples, deposited by CVD or physical vapor deposition (PVD), for example.

A seed layer 18 is deposited or formed over the conductive liner 16. Preferably, the seed layer 18 comprises a conductive material comprising, for example, copper, and is deposited by PVD or CVD. In accordance with embodiments of the invention, the conductive liner 16 and seed layer 18 are adapted to improve the deposition of conductive material subsequently deposited in second regions 17. The conductive liner 16 and seed layer 18 also function as a MIMCap bottom plate in first region 19.

A resist 20 is deposited over the entire wafer 10 surface, over the first conductive layer. The resist 20 preferably comprises a photoresist or other type of organic polymer typically utilized as a resist material in the art. The resist 20 does not completely fill the trenches 13/15, but rather, leaves gaps 22 remaining within the bottom of the trenches 13/15.

Figure 3:
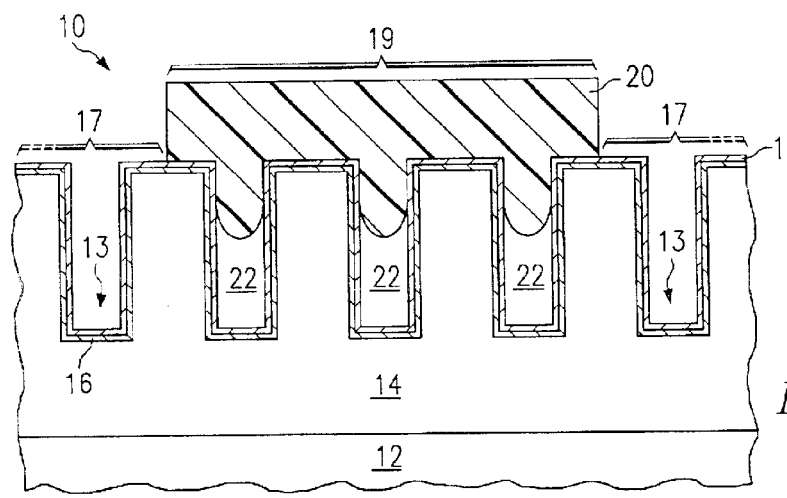

The wafer 10 is exposed to a lithography process to pattern the resist 20, and the resist 20 is exposed. The resist 20 over second region 17 is removed, leaving trenches 13 in second region 17 exposed, as shown in FIG. 3.

A lithography pattern is formed so that the MIMCap regions are opened and other areas blocked by the resist 20. A lithography mask, not shown, may be used to pattern the resist 20 with a predetermined pattern that defines the shape, size and location for at least one vertical/horizontal MIM-Cap. The wafer 10 is exposed, for example, to a UV light, and developed to remove undesired portions of resist 20 using either a positive or negative exposure process, leaving the structure shown in FIG. 3 having resist portions 20 residing over regions 19, leaving regions 17 exposed.

Figure 4:
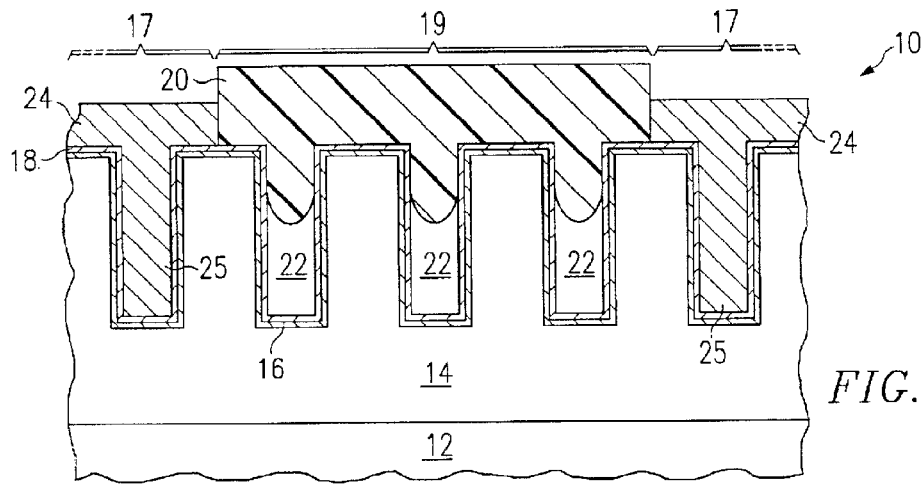

A second conductive material 24 is deposited over the wafer 10, as shown in FIG. 4 to form first conductive lines 25 in second regions 17. The second conductive material 24 preferably comprises a metal such as copper, and alternatively, may comprise other conductive materials such as Al, TiN, Ti, W, other conductive materials, or combinations thereof, deposited by PVD or CVD, as examples. The second conductive material 24 may be part of an M1 or M2 metallization layer, for example. The depth of first conductive lines 25 may be the same as other metallization lines of the wafer 10, or the depth of first conductive lines 25 may be the total thickness of a via and wiring line, for example, the total thickness of the first insulating layer 14.

The trenches 15 in the first region 19 of the wafer 10 are blocked by resist 20, and therefore are not covered by the second conductive material 24.

Figure 5:
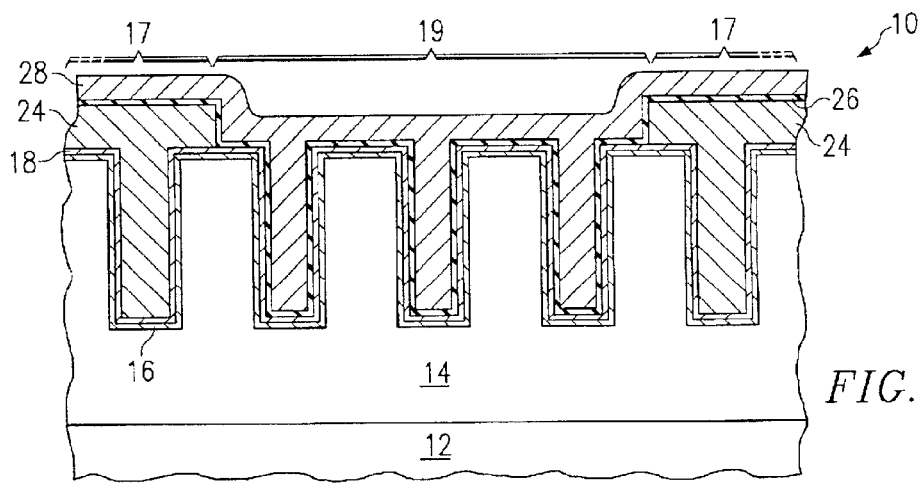

The resist 20 is removed, and a thin dielectric layer 26 is disposed over the wafer 10, covering the second conductive material 24 in the second regions 17, and also covering exposed portions of the seed layer 18 in first regions 19, as shown in FIG. 5. The thin dielectric layer 26 is preferably conformal and comprises a thickness in a range of between approximately 10 nm to 200 nm, as an example. Preferably, the dielectric material 26 comprises silicon nitride, $Ta_2O_5$, or combinations thereof, deposited by plasma enhanced chemical vapor deposition (PECYD). Alternatively, the thin dielectric layer 26 may comprise other dielectric materials such as SiC, saline oxide, tetraethoxysilane (TEOS), silicon dioxide, silicon nitride, silicon oxynitride, barium strontium titanate (BST) or other insulators, as examples. Preferably, the thin dielectric layer 26 is relatively thin, e.g., 10 nm to 200 nm thick, and is conformal. Thin dielectric layer 26 functions as a capacitor dielectric 26 of MIMCap's in region 19, e.g., thin dielectric layer 26 comprises the capacitor dielectric between the vertical/horizontal MIMCap plates comprised of conductive liner 16/seed layer 18, e.g., the first conductive layer, and a third conductive material 28.

The third conductive material 28 is deposited over the wafer 10, as shown in FIG. 5. The third conductive material 28 is deposited over the thin dielectric layer 26 to fill the trenches 15 in the first region 19 of the wafer 10. The third conductive material 28 comprises the top plate of vertical MIMCap's in region 19. The third conductive material 28 preferably comprises W, TiN, Al, Ta, Ti, TaN, TiW, Cu, Si, or combinations thereof deposited by PVD or CVD, as examples. The third conductive material may comprise any conducting material such as a metal, and preferably comprises CVD W or CVD Al. Alternatively, the third conductive material 28 may be formed by plating, for example.

Figure 6:
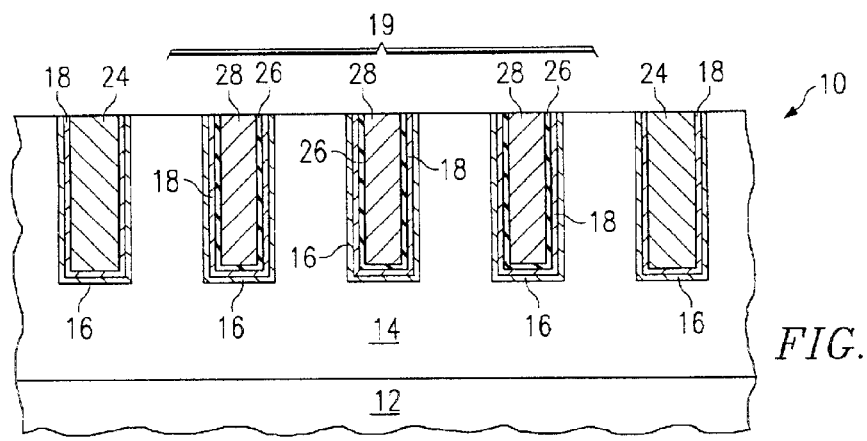

Finally, a chemical-mechanical polish (CMP) process is performed to remove all materials 28/26/24/18/16 from above the top surface of the insulating layer 14 of the wafer 10. For example, the conductive liner 16, seed layer 18, first conductive material 24, thin dielectric layer 26, and second conductive layer 28 are removed from the top surface of the wafer 10 during the CMP process, as shown in FIG. 6.

A plurality of vertical MIMCap's may be formed in the insulating layer 14 first region 19, and at least two of the vertical MIMCap's may be coupled together.

Embodiments of the present invention have been described herein with resist 20 comprising a positive resist. Alternatively, resist 20 may comprise a negative resist 20, for example. Furthermore, although several vertical/horizontal MIMCap's are shown in region 19 of FIG. 6, a plurality of other MIMCap's may be formed within a single insulating layer 14.

While cross-sectional views of the present vertical MIMCap are shown in FIGS. 1 through 6, the MIMCap conductive lines 25 are preferably square or rectangular, and may run lengthwise along the semiconductor wafer 10 by a distance (not shown) according to the capacitance desired. Alternatively, rather than being parallel, the first and second conductive lines 25 may form other shapes such as U-shape, circles or zig-zags, for example.

Embodiments of the present invention provide several advantages over prior art processes for fabricating vertical MIMCap's. Advantages of embodiments of the invention include providing a method of fabricating a vertical MIMCap in a BEOL process, where no additional etch steps are required for manufacturing the vertical MIMCap. A single CMP step is used to form conductive lines 25 and vertical MIMCap's in region 19 simultaneously. The vertical MIMCap dielectric 26 may be deposited using PECVD. The vertical MIMCap bottom plate is comprised of a conductive liner 16 and a seed layer 18. A resist layer 20 is used to mask vertical MIMCap regions 19 while the conductive lines 25 are filled with second conductive material 24.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of fabricating a vertical metal-insulator-metal capacitor (MIMCap), comprising:
   providing a workpiece;
   depositing an inter-level dielectric over the workpiece;
   patterning the inter-level dielectric to form a plurality of trenches having substantially vertical sidewalls and equal height and width dimensions;
   defining a first region of said inter-level dielectric comprising first trenches of said plurality of trenches for at least one MIMCap and defining a second region of said inter-level dielectric comprising second trenches of said plurality of trenches for a plurality of conductive lines;
   depositing a conductive liner over the inter-level dielectric and within the trenches of said first and second regions;
   depositing a seed layer over the conductive liner;
   depositing a resist over the seed layer;
   selectively removing the resist over the seed layer in the inter-level dielectric second region and leaving resist over the seed layer in the inter-level dielectric first regions;
   depositing a first conductive material within the inter-level dielectric second region trenches to overfill the trenches and to form said plurality of conductive lines;
   removing the resist covering the first region;
   depositing a MIMCap dielectric over the first conductive material within the second region trenches and over the first conductive layer within the first region trenches; and
   depositing a second conductive material over the MIMCap dielectric within the first region trenches to form a MIMCap top plate, wherein the second conductive material overfills the first region trenches.

2. The method according to claim 1, wherein the conductive liner and conductive seed layer comprise at least one MIMCap bottom plate.

3. The method according to claim 1, wherein depositing the conductive liner comprises depositing TaN, Ta, TIN or combinations thereof by chemical vapor deposition (CVD) or physical conductive vapor deposition (PVD), wherein forming the conductive seed layer comprises depositing a copper seed layer by PVD or CVD.

4. The method according to claim 1, wherein depositing the first conductive material layer comprises depositing copper by electroplating or physical vapor deposition (PVD), wherein depositing the second conductive material comprises depositing W, TiN, Al, Ta, Ti, TaN, TiW, Cu, Si, or combinations thereof by physical vapor deposition (PVD) or chemical vapor deposition (CVD).

5. The method according to claim 1, wherein depositing the MIMCap dielectric comprises depositing a conformal dielectric having a thickness of approximately 10 nm to 200 nm.

6. The method according to claim 5, wherein depositing the MIMCap dielectric comprises depositing silicon nitride, $Ta_2O_5$, or combinations thereof by plasma-enhanced chemical vapor deposition (PECVD).

7. The method according to claim 1, further comprising chemically-mechanically polishing (CMP) the workpiece to remove the conductive liner, seed layer, first conductive material, MIMCap dielectric, and second conductive material from the top surface of the inter-level dielectric, to form at least one vertical MIMCap in the first region of said inter-level dielectric.

8. The method according to claim 7, wherein a plurality of vertical MIMCap's are formed in said first region of the inter-level dielectric, further comprising coupling at least two of the vertical MIMCap's together.

9. The method according to claim 7, wherein the CMP simultaneously forms at least one MIMCap in the first region of the inter-level dielectric and the plurality of conductive lines in the second region of the inter-level dielectric.

10. A method of fabricating a metal-insulator-metal capacitor (MIMCap), comprising:
    depositing an insulating layer over a workpiece;
    forming a plurality of trenches, each trench of said plurality including a bottom and substantially vertical sidewalls and each trench having substantially equal height and width dimensions;
    depositing a first conductive layer over the insulating layer and over the bottom and sidewalls of each trench of said plurality of trenches;
    defining a region of said insulating layer having at least one trench of said plurality of trenches as a MIMCap region and defining another region of said insulating layer having other trenches of said plurality of trenches as a wiring region;
    forming a resist over the MIMCap region of the insulating layer and leaving the wiring region uncovered;
    depositing a second conductive material over the uncovered wiring region of the insulating layer such that said second conductive material overfills the trenches in the wiring region;
    removing the resist from the MIMCap region to expose trenches in the MIMCap region;
    depositing a thin dielectric layer over the second conductive material covering the wiring region including the overfilled trenches and over the exposed first conductive layer within the MIMCap region trenches; and
    depositing a third conductive material over the thin dielectric layer within the MIMCap region trenches such that the MIMCap region trenches are overfilled.

11. The method according to claim 10, wherein depositing the second conductive material comprises depositing copper by electroplating or physical vapor deposition (PVD), wherein depositing the third conductive material comprises depositing W, TiN, Al, Ta, Ti, TaN, TiW, Cu, Si, or combinations thereof by physical vapor deposition (PVD) or chemical vapor deposition (CVD), and wherein the third conductive material forms the MIMCap top plate.

12. The method according to claim 10, wherein depositing the thin dielectric layer comprises depositing a conformal dielectric having a thickness of 10 nm to 200 nm.

13. The method according to claim 12, wherein depositing the thin dielectric layer comprises depositing silicon nitride, $Ta_2O_5$, or combinations thereof by plasma-enhanced chemical vapor deposition (PECVD).

14. The method according to claim 10, further comprising chemically-mechanically polishing (CMP) the surface of the workpiece to remove the first conductive layer, second conductive material, thin dielectric layer, and third conductive material from the top surface of the insulating layer, to form at least one vertical MIMCap in the MIMCap region of the insulating layer.

15. The method according to claim 14, wherein a plurality of vertical MIMCap's are formed in the MiMCap region of the insulating layer, further comprising coupling at least two of the vertical MIMCap's together.

16. The method according to claim 14, wherein the CMP simultaneously forms MIMCap's in the MIMCap region of the insulating layer and conductive wiring in the wiring region of the insulating layer.

17. The method according to claim 10, wherein depositing the first conductive layer comprises depositing a conductive liner.

18. The method according to claim 17, wherein depositing the first conductive layer comprises forming a conductive seed layer over the conductive liner.

19. The method according to claim 18, wherein the conductive liner and conductive seed layer comprise at least one MIMCap bottom plate.

20. The method according to claim 18, wherein depositing the conductive liner comprises depositing TaN, Ta, TiN or combinations thereof by chemical capor deposition (CVD) or physical conductive vapor deposition (PVD), and wherein forming the conductive seed layer comprises depositing a copper seed layer by PVD or CVD.

* * * * *

UNITED STATES PATENT AND TRADEMARK OFFICE
CERTIFICATE OF CORRECTION

PATENT NO. : 6,960,365 B2
DATED : November 1, 2005
INVENTOR(S) : Ning

It is certified that error appears in the above-identified patent and that said Letters Patent is hereby corrected as shown below:

Column 5,
Line 7, delete "(PECYD)" and insert -- (PECVD) --.

Column 6,
Line 67, delete "layer".

Column 8,
Line 48, delete "capor" and insert -- vapor --.

Signed and Sealed this

Seventeenth Day of January, 2006

JON W. DUDAS
*Director of the United States Patent and Trademark Office*